(12) United States Patent
Matthias et al.

(10) Patent No.: US 12,300,929 B2
(45) Date of Patent: May 13, 2025

(54) POWER MODULE AND PROCESS FOR MANUFACTURING THE SAME

(71) Applicant: SwissSEM Technologies AG, Lenzburg (CH)

(72) Inventors: Sven Matthias, Lenzburg (CH); Raffael M. Schnell, Seon (CH); Chantal I. T. Toker, Lenzburg (CH)

(73) Assignee: SWISSSEM TECHNOLOGIES AG (CH)

( * ) Notice: Subject to any disclaimer, the term of this patent is extended or adjusted under 35 U.S.C. 154(b) by 625 days.

(21) Appl. No.: 17/508,410

(22) Filed: Oct. 22, 2021

(65) Prior Publication Data

US 2022/0131296 A1 Apr. 28, 2022

(30) Foreign Application Priority Data

Oct. 23, 2020 (EP) .................................... 20203681
Jun. 18, 2021 (EP) .................................... 21180413

(51) Int. Cl.
*H01R 13/629* (2006.01)
*H01L 23/00* (2006.01)
*H01L 23/31* (2006.01)
*H01L 25/07* (2006.01)

(52) U.S. Cl.
CPC ....... *H01R 13/629* (2013.01); *H01L 23/3107* (2013.01); *H01L 24/48* (2013.01); *H01L 24/49* (2013.01); *H01L 25/072* (2013.01)

(58) Field of Classification Search
CPC ... H01R 13/629; H01L 23/3107; H01L 24/48; H01L 24/49; H01L 25/072
See application file for complete search history.

(56) References Cited

U.S. PATENT DOCUMENTS

| | | | |
|---|---|---|---|
| 2010/0013085 A1 | 1/2010 | Oi et al. | |
| 2010/0165582 A1 | 7/2010 | Hornkamp | |
| 2015/0255903 A1 | 9/2015 | Fujii et al. | |
| 2017/0194296 A1 | 7/2017 | Yasui | |
| 2020/0279791 A1* | 9/2020 | Finarelli | ................. H01L 25/18 |

FOREIGN PATENT DOCUMENTS

| | | |
|---|---|---|
| DE | 112016002302 T5 | 3/2018 |
| EP | 3989274 A1 | 4/2022 |
| JP | 2014-49582 A | 3/2014 |

* cited by examiner

*Primary Examiner* — Michelle Mandala
*Assistant Examiner* — Jordan M Klein
(74) *Attorney, Agent, or Firm* — Straylight LLP

(57) ABSTRACT

Power module has press-fit pins for the electrical and mechanical connection for the terminals, insertable into sleeves on the substrate. The substrate rests on a baseplate. Potential alignment frame ensures the accuracy of all elements. The mechanical and electrical connection of the power and signal terminals is realized by multiple (high-current) or single press-fit connections. When inserting the pins, they are fitting tightly in these sleeves by overcoming a frictional force and after fitting is established, for each single pin-fit, an electrical contact over a surface is established.

10 Claims, 9 Drawing Sheets

POWER MODULE AND PROCESS FOR MANUFACTURING THE SAME

CROSS-REFERENCE OF RELATED APPLICATIONS

The present application claims benefit and foreign priority to EP 20203681.0 filed Oct. 23, 2020 and EP 21180413.3 filed Jun. 18, 2021, each of which are incorporated by reference.

FIELD

The present disclosure related to power modules.

BRIEF DESCRIPTION OF THE DRAWINGS

The present disclosure can be more clearly understood from the following description given by way of example, in which:

FIG. 13 is an example isometric view of a power-module according to this invention with the plastic housing not yet pressed on.

DETAILED DESCRIPTION

Figure 1:
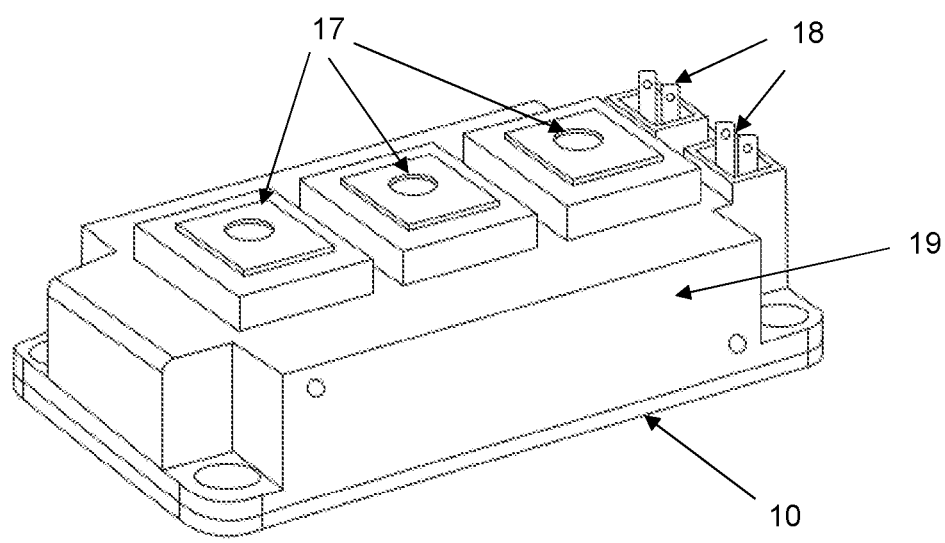
FIG. 1 is an example of a state of the art power module in isometric view.

Power modules in the kilo watt range or above are applied in millions of units each year in industrial applications or electric vehicles. They serve for the handling of the electrical current and ensure the mechanical support of the connections. Such modules are built into inverters for electric vehicles, drives for industrial applications like elevators, fan-controllers etc. The highly efficient production of these modules is as demanding as the thermal and electrical properties and the reliability levels requested by the customers are high. Critical is the electrical connection of the signal and power-terminals to the internal conducting layers. Presently approx. 10 million units of such Power Modules are being manufactured annually and this manufacturing process is still a challenging endeavor. The expected product lifetime is approx. 10 to 15 years.

A typical power module comprises a convexly bowed baseplate, attached thereto integrated substrates with an insulation layer and a conducting top-side metal sheet with attached chips (e.g. IGBTs, diodes, MOSFETs etc.) and wire-bonds for the electrical connections, power- and signal terminals for external busbar attachments and external controlling. The power terminals for high-currents beyond 150 A and the signal pins are either soldered, welded or connected by multiple parallel bonded wires to the top-substrate metallization. This ensures typically low electrical resistances.

The mass production of such power modules is a challenge, technically burdensome and an enduring fight against the cost since there is an ever going on prize battle over pennies in the market. Presently, the production requires manual handling operations with multiple soldering steps. They always have a certain potential of re-melting of previously generated solder-layers which does negatively impact the reliability. The fixtures are complex to keep all materials in place. Some terminals might mechanically shield the substrates and limit the accessibility. In summary, the production method is rather inefficient. This was the starting point to look for a better design and production process solution for such a power module.

The task of this invention is therefor to create a power module which allows to improve the assembling, making it easier, quicker and more economic, and ensuring a stronger and better electrical and mechanical connection for all terminals and simultaneously ensuring a tremendous performance gain, e.g. lower resistive losses and lower internal stray inductances tailored for Silicon-carbide chips. Furthermore, it is a task of this invention to provide, based on the particular design, a more efficient production process for such a Power Module which ensures a long-lifetime and the establishment of safe electrical contacts and above all which is far more economic for manufacturing lines, avoiding manual operations.

The problem is solved by a Power Module according to claim 1. It is formed of two complex parts which will be joined in a single process step and sealed by glue. The top part is a housing assembly comprised of a plastic case with e.g. three molded power and e.g. four signal terminals, which provide the external electrical connection according to the established industry standard for such 62 mm wide modules. Inside the housing the downward facing ends of the power-terminals result in multiple parallel press-fit pins and the signal-terminals result in just one press-fit pin. Each power terminal will carry a current well above 150 A during operation. Hence, multiple pins are suggested to improve the conductivity and reduce the current flowing per press-fit pin to improve reliability. The signal pins will carry currents below 1 A and are less demanding and can be consequently made of thinner material, which requires a different press-fit design. All these press-fit pins are facing downwards towards the bottom part and have the same height and tolerance of merely 0.05 mm which makes clear that they must be aligned perfectly and also fit perfectly. The terminals are preferably made from Copper with a hardness >60 HV.

The manufacturing process is characterized by claim 1. Simulations reveal a very low on-resistance which is up to a factor of two lower than the ones of modules of the state of the art with identical outline. The internal stray inductance is also up to a factor of two lower compared to modules of the state of the art. With the highly efficient utilization of the substrate area, the world-wide highest current ratings can be achieved on such a power-module footprint.

The power modules of the state of the art and then the ones according to this invention will be shown in the figures by way of example and they will be described along these figures in the following.

A typical power module of 62 mm width according to the state of the art is shown in a perspective view in FIG. 1. With its baseplate 10, housing 19 on top of the baseplate 10 and the electrical connections 17 on its top and the signal terminals 18. The dimensions of the shown module base plate are about 62 mm$^2$×106 mm$^2$.

Figure 2:
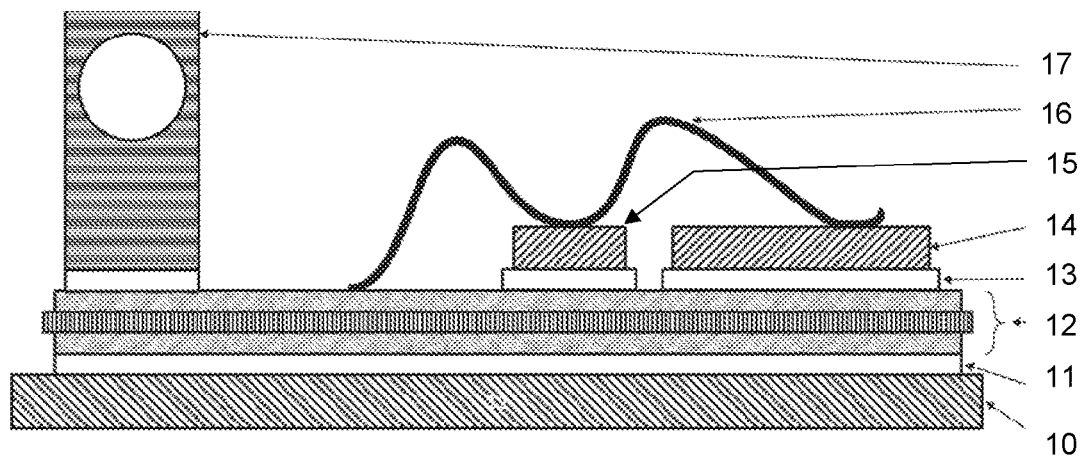
FIG. 2 is a cross-sectional view through a typical state of the art power module with typical layers.

A typical power module stack according to the state of the art is shown in a generic cross-section in FIG. 2. It comprises a baseplate 10, attached or integrated substrates 12 on a solder or sinter layer 11 with attached chips 14/15 (e.g. IGBTs, diodes, MOSFETs etc.) on a solder/sinter layer 13 which is put onto the top layer of the substrate 12, wirebonds 16 for the electrical connections, power terminals 17—and similar but not shown signal terminals for external busbar attachment and external controlling. The power terminals 17 for high-currents and the signal pins are either soldered, welded or connected by multiple parallel bonded wires to the top-substrate metallization. This ensures typically a low electrical resistance.

Figure 3:
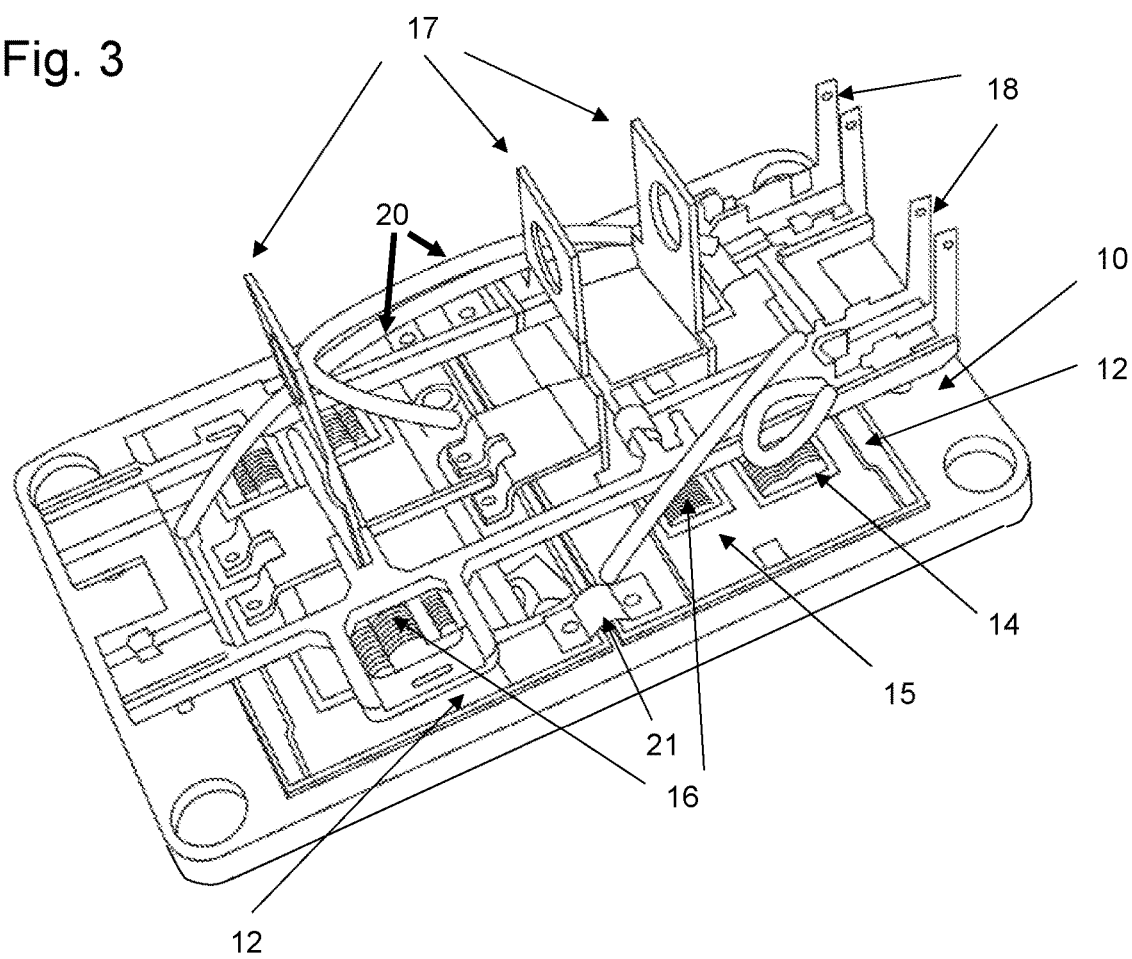
FIG. 3 is a state of the art interior of a power module of FIG. 1 realization.

FIG. 3 shows the interior of a typical power module of FIG. 1 at an intermediate stage of the assembly process without the housing. Insulated-Gate Bipolar Transistors (IGBT) 14 and diode chips 15 are resting on the substrates 12. Wire bonds 16 electrically connect the top-side of the chips with the substrates 12. The substrates 12 rest on a baseplate 10. The electrical substrate-to-substrate connection is done with individually placed sheets 21. Power terminals 17 are soldered to the substrates 12. The signal terminals 18 are connected by insulated wires 20. As can be understood, many precise operations are needed to manufacture such module.

Figure 4:
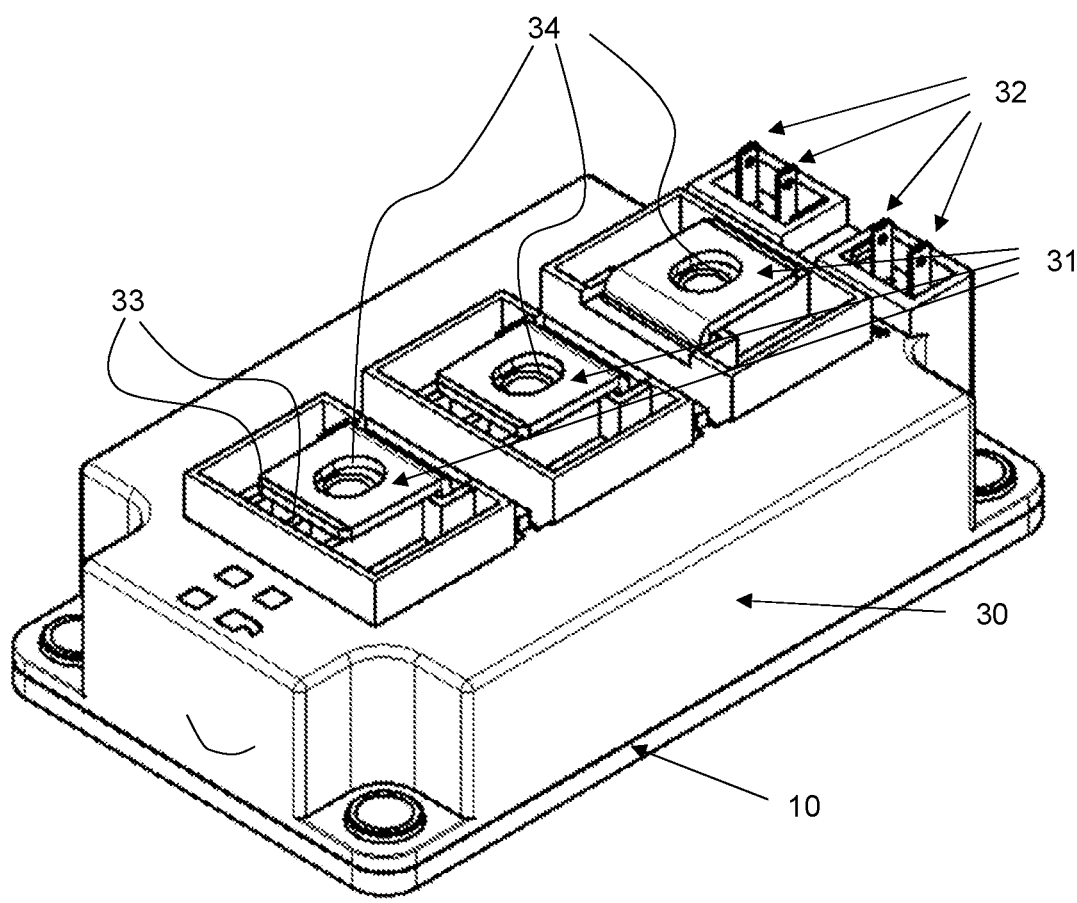
FIG. 4 is an example of a power module in isometric view fully assembled.

FIG. 4 shows an assembled power module according to the present invention. The external power terminals 31 and signal terminals 32 are directly molded into the plastic of the housing 30. This housing assembly then rests as an entity on a baseplate 10. The power terminals 31 are supported by multiple ridges 33 as part of the housing 30 to form solid supports for the terminals 31 when contact plates are tightly screwed onto these terminals 31 by inserting screws into the screw nuts 34 positioned below the terminals 31. These screws will then brace the contact plates tightly to the terminals 31.

Figure 5:
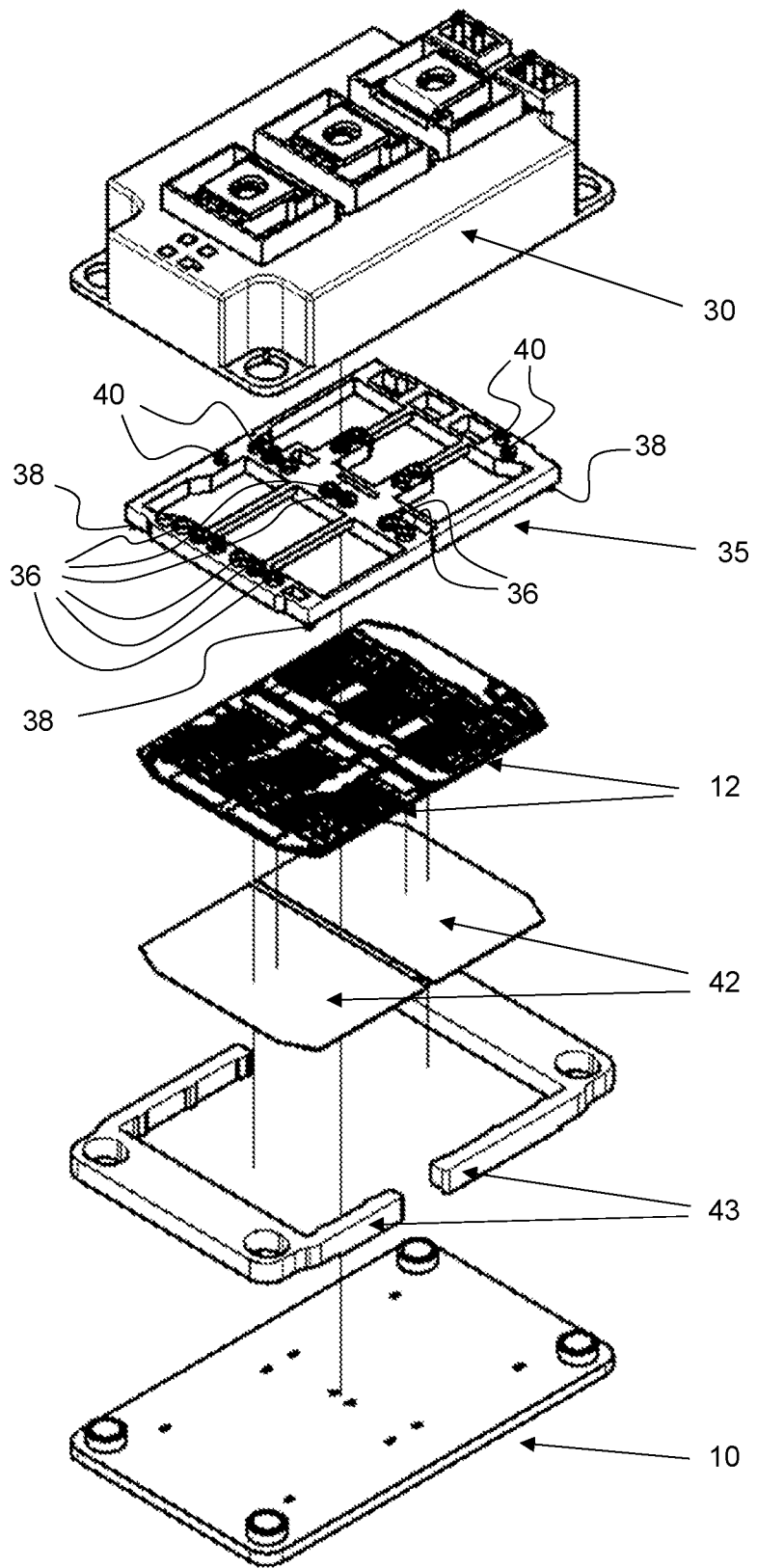
FIG. 5 is an example of a power module in an exploded view.

FIG. 5 shows a power module according to the present invention in exploded view. On top is the top-part housing assembly 30. The bottom part assembly comprises a baseplate 10, solder/sinter 42 preforms for the attachment for the substrates 12 with IGBTs, diodes, wirebonds. In an alignment frame 35 shown overhead the substrates 12, there are pre-applied preforms at the precisely corresponding positions of the Copper sleeves and sheets incorporated in this alignment frame 35. This entire bottom part is assembled by a fully automated robot and all layers are merged in a single high temperature soldering/sintering step to form a solid unit. For the automatic robot manufacturing, a temporary fixture 43 for future alignment purposes is placed on a fresh baseplate 10. An automatic pick-and-place by the robot is carried out to position solder-preforms and the fully bonded substrates 12 on the baseplate 10. Subsequently, the alignment-frame 35 is put on top. The alignment frame 35 aligns the substrates 12 underneath during this high temperature processing, when the solder is molten, and the substrates 12 tend to "swim" on the solder/sinter 42. The alignment frame 35 is kept in good alignment to the baseplate 10 by a temporarily applied fixture-set 43 that is removed once forming of the solid bottom part is completed. The top-part housing 30 assembly and the bottom part assembly are perfectly adjusted to one another and are merged in a press-in process by which the press-fit pins within the housing 30 are inserted into the respective sleeves 36, 40 in the alignment frame 35, requiring a high force in vertical direction exceeding 1 kN. Glue is dispensed to the housing assembly 30 prior applying the pressure. Then the housing assembly 30 is aligned to the bottom part and mounted to the baseplate 10. With a press-in force of about 40 to 150N per pin 34 at a speed of 1 to 50 mm/s this might for a high-power module result in press-in force of about 1 kN per housing assembly. Afterwards the glue is cured and an isolation gel is applied.

In more detail as described above, the bottom-part assembly is formed by using the alignment frame 35 to position the ceramic substrates 12 with a conductive Cu-top and bottom-side on the baseplate 10. These substrates 12 are attached by pre-applied solder or sinter 42 preforms at the corresponding positions of the Copper-structures incorporated in the alignment frame 35, IGBTs, diodes and wirebonds (named substrate or substrates). The solder/sinter 42 preforms an even and solid connection to the convexly pre-bowed baseplate 10. This pre-bow of the baseplate 10, although it is being slightly altered during the assembly process, will still be present at the final module stage to improve the thermal resistance when the module is mounted to a heat sink in application. This stack of multiple materials and layers is assembled by a fully automatic pick-and-place system or robot. During a single high-temperature process step—soldering or sintering—the alignment frame 35, the substrates 12 and the baseplate 10 will be joined together tightly. The alignment frame 35 consists of a high-temperature capable plastic with incorporated Copper sheets for the electrical substrate-to-substrate connection and multiple soft Copper sleeves 36, 40 with a hardness <60 HV.

In general, a critical and crucial step is the lateral positioning and the orientation of the Copper sleeves 36, 40 towards the press-fit pins 41 of the top-part housing 30 assembly and the alignment of the Copper sheets towards the substrates 12. This is generated by the alignment frame 35 which is formed by an assembled structure of a high temperature capable plastic with molded precisely positioned Copper sleeves 36, 40 and Copper sheets. In addition, this alignment frame 35 comprises downward facing pillars 38 at the outer edges and a spacer 39 (FIG. 9) in the center area to support precise positioning of the substrates 12 underneath. The spacer 39 in the center area separates the two substrates 12 from each other and sets a minimum distance, while in contrast, the downward facing pillars 38 at the outer edges restrict the maximum distance of the substrates 12. The alignment frame 35, substrates 12 and baseplate 10 are joined in a single high temperature >200° C. solder/sintering process to each other. The alignment features of the alignment frame 35 keep the substrates 12 in place during the high-temperature process, when these substrates 12 tend to "swim" on the liquid solder/sinter 42 layer. Temporarily applied fixtures 43 mounted to the baseplate 10 guarantee the position of the alignment frame 35 with respect to the baseplate 10.

Figure 6:
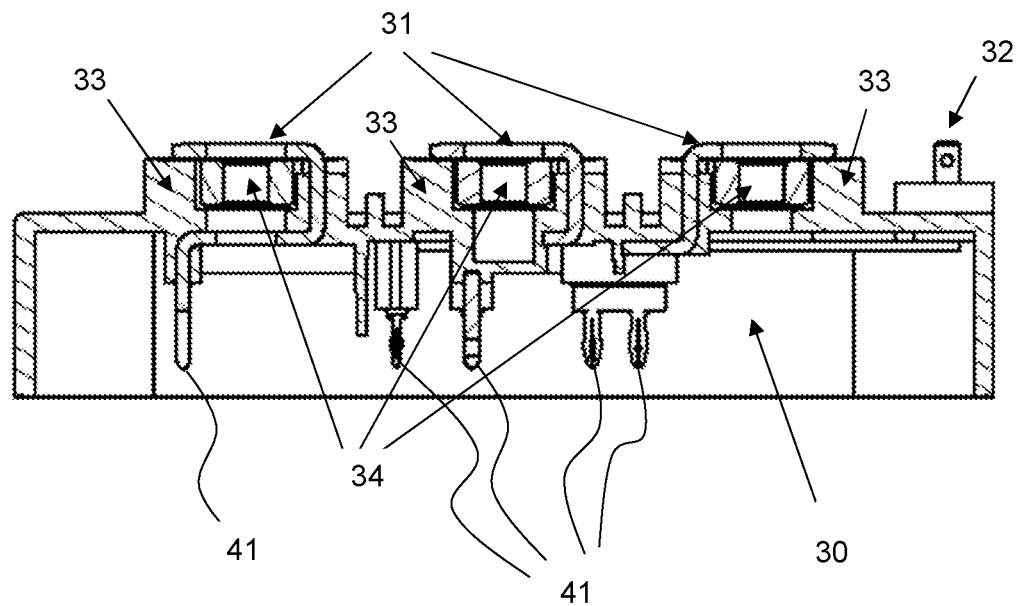
FIG. 6 is an example of a top part housing assembly with molded power-terminals, integrated nuts in cross-sectional view.

At a final assembly process of the power module according to this invention, the top-part housing assembly 30 is aligned with its press-fit pins towards the alignment frame 35 of the bottom part. The top-part and the bottom-part will be merged when the the top-part is pressed down to the bottom part, while the press-fit pins 41 as shown in FIG. 6 penetrate the sleeves 36, 40 and form an almost uniform material and perfectly reliable electrical connection. The plastic housing 30 will consequently rest on the baseplate 10 and be sealed thereon with glue. The force in vertical direction will exceed 1 kN and requires a very solid structure that is capable to support the force applied to the top-side of the power terminals towards the press-fit pins 41 underneath.

The Copper sleeves 36, 40, which are soldered/sintered to the substrates 12, together with the press-fit pins 41 generate the low resistance electrical connection of the external terminals towards the substrates 12. The Copper sheets integrated into the alignment frame 35 are also soldered/sintered to the substrates 12 and generate the low-resistance electrical connection between the substrates 12. The strong initial convex bow of the baseplate will be slightly reduced during the high temperature process steps. However, a certain convex final bow will remain in the final module and is desired for optimal thermal resistance when mounted on an even surface of a heat sink. The consequence is, that substrates are bent as well. The soldering/sintering of the Copper-sleeves, incorporated in the alignment frame, to the substrates can be supported by individually adjustable distances that the sleeves are sticking out of the alignment frame. As such, these distances are anticipating the bow and therefore effectively compensate the resulting less pronounced bow.

It is important to note that the electrical signal propagates from specific locations on the substrate 12 through the signal terminals 32 above the substrates. This relieves a lot of substrate 12 area otherwise needed for Copper-tracks for signal propagation and enables a high area utilization.

FIG. 6 shows the housing assembly 30 of molded terminals 31 and 32 completed by integrated screw nuts 34. Due to the ridges 33 which are a part of the housing assembly 30 and the internal supporting structure, the plastic housing 30 and the molded terminals 31 form a solid assembly which withstands high mechanical forces applied to the top-side of the power terminals. All terminals 31 and 32 have at least one or multiple downward-facing press-fit pins 41. All pins 41 are split in two legs along their longitudinal axis which form two slightly curved arches bent outward.

Figure 7:
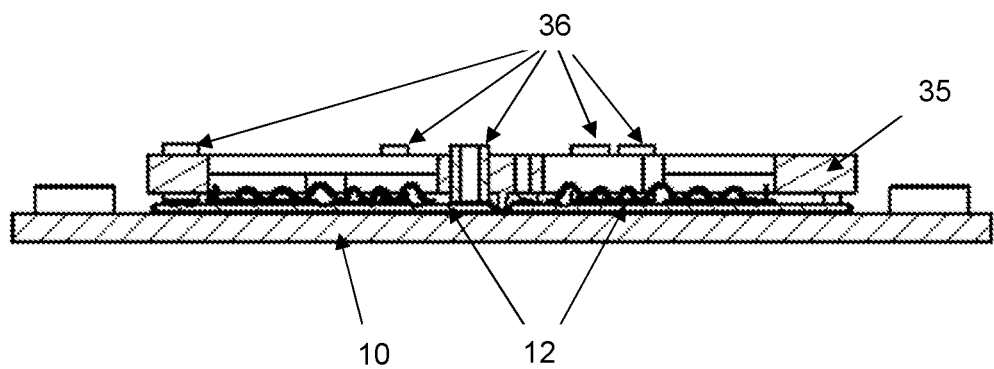
FIG. 7 is an example of a bottom part assembly comprising the alignment frame connected to the substrates, which rest on the baseplate in cross-sectional view.

FIG. 7 shows a cut through the bottom part of the power module according to the present invention. Substrates 12 rest on the baseplate 10. The alignment frame structure 35 ensures precise positioning and orientation of the incorporated Copper sleeves 36 and Copper sheets (not visible in this figure). These sleeves and sheets are soldered/sintered to the substrates 12 and form a solid and complex bottom part assembly together with the baseplate 10.

Figure 8:
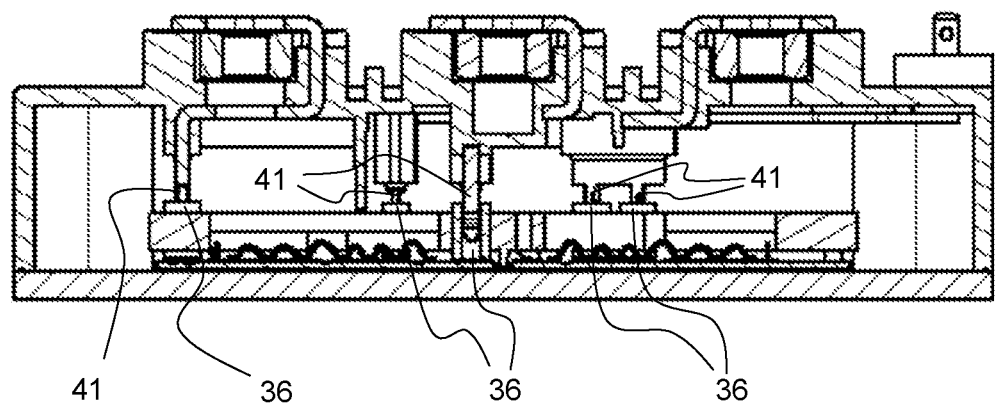
FIG. 8 is an example of a merged top and bottom part forming the power module in cross-sectional view.

FIG. 8 shows the cut through the joined top and bottom part of the power module according to the present invention after the merge. The press-fit pins 41 have been inserted into the sleeves 36 by a high pressing force to overcome the strong frictional forces and to ensure a perfect and durable mechanical and electrical connection. The arches of the two legs of the pins 41 are squeezed together.

Figure 9:
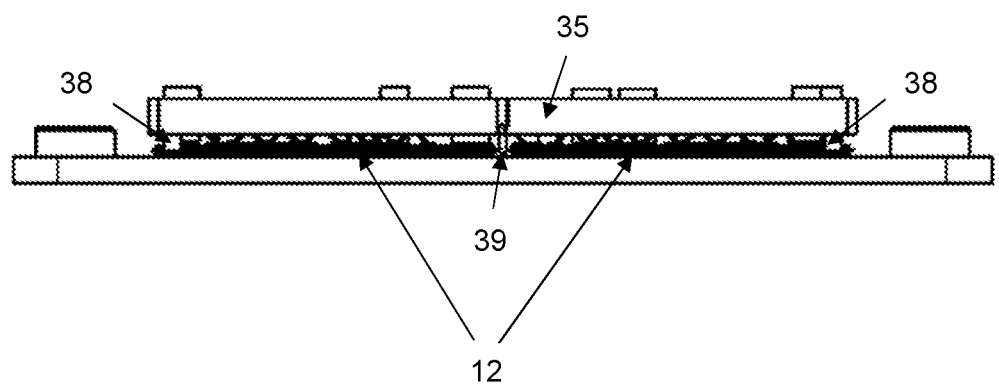
FIG. 9 is an example cross-sectional view of the bottom part highlighting the alignment features of the alignment frame.

FIG. 9 shows the cross-section of the bottom part of the power module according to the present invention. The alignment frame 35 is ensuring precise alignment by the pillars 38 and the spacer 39 of the substrates 12 to the alignment frame.

Figure 10:
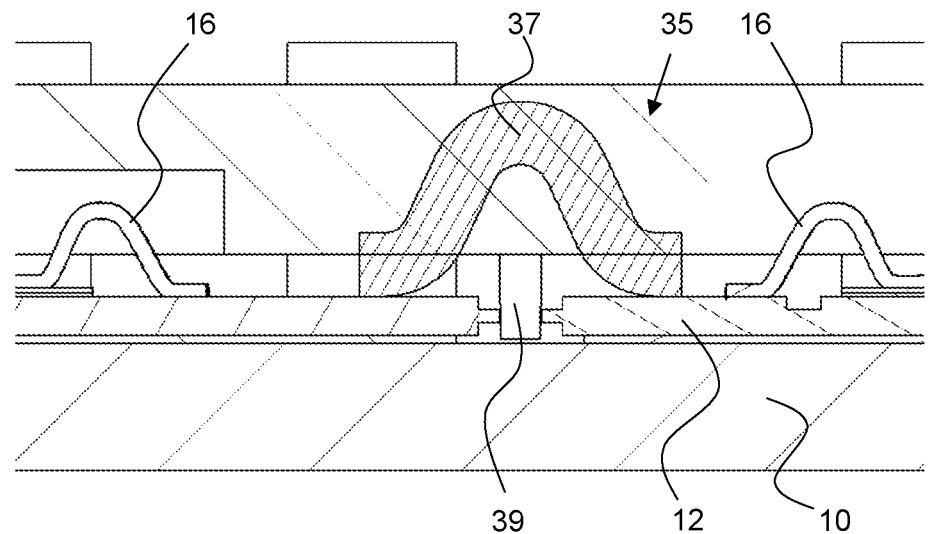
FIG. 10 is an example enlarged cross-sectional view of the central part of the alignment frame focusing on the spacer and the incorporated copper sheet.

FIG. 10 shows an enlarged view of the area around the central metal sheet 37 incorporated in the alignment frame 35 and electrically connecting the substrates 12. The spacer 39 sets a minimum distance between the substrates 12.

Figure 11:
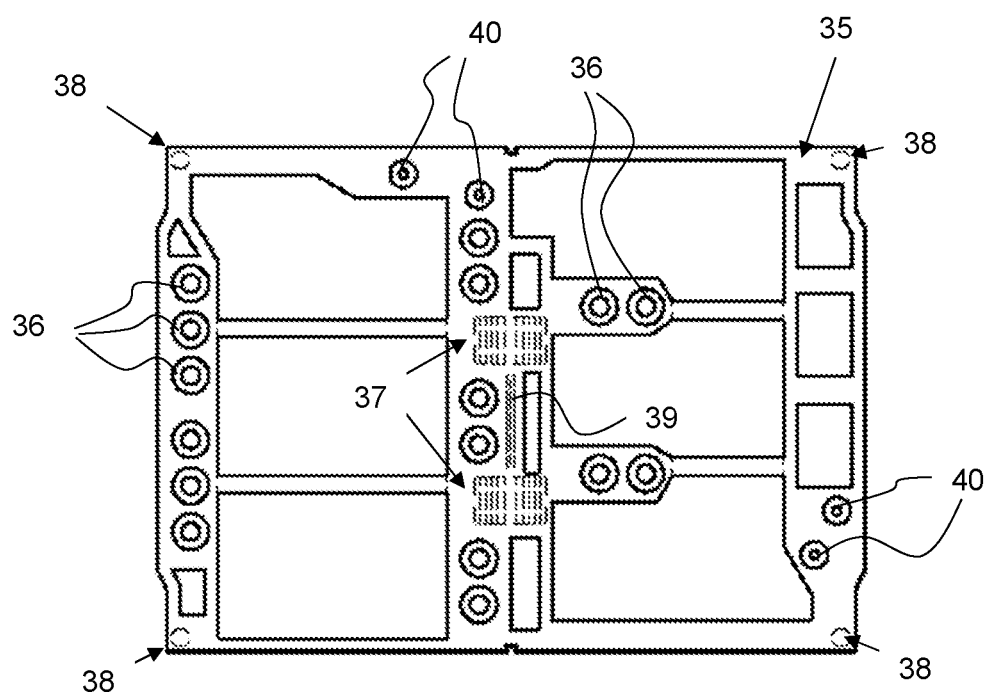
FIG. 11 is an example alignment frame with molded sleeves in a top view—as potential realization variant.

FIG. 11 shows a top-view of the alignment frame 35 with molded Copper sleeves 36 and smaller sleeves 40. Downward facing and (hidden) the Copper sheets 37, the spacer 39 and the pillars 38.

Figure 12:
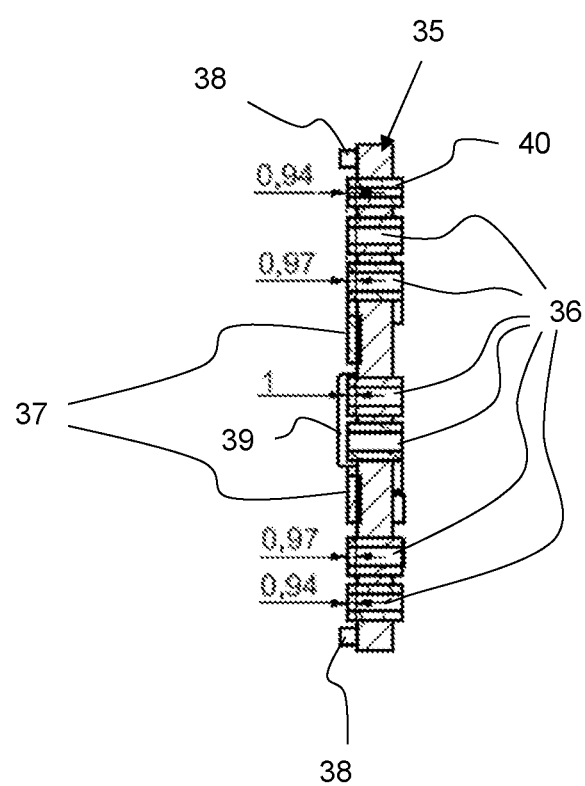
FIG. 12 is an example cross-sectional view of an alignment frame variant highlighting the individually adjusted stick-out dimension of the sleeves incorporated in the alignment frame.

FIG. 12 shows an alignment frame 35 with the pillars 38, the spacer 39 together with the molded Copper sheets 37, sleeves 36 and smaller sleeves 40. The distance of the sleeves 36 and 40 are sticking out of the alignment frame, and this sticking out can be adjusted individually to support the assembly process. In this figure, the indicated measures of 0.94 mm, 0.97 mm or 1 mm are the measures by which the sleeves 36, 40 are sticking out of the frame. This feature is relevant to anticipate the convex bow of the baseplate 10 that is transferred to the substrates 12 and consequently results in a bent topology, which is impacting soldering/sintering and reliability. By the individually adjusted sticking out an equaling of the sleeves 36, 40 in relation to the finally less bent baseplate 10 can be reached.

Figure 13:
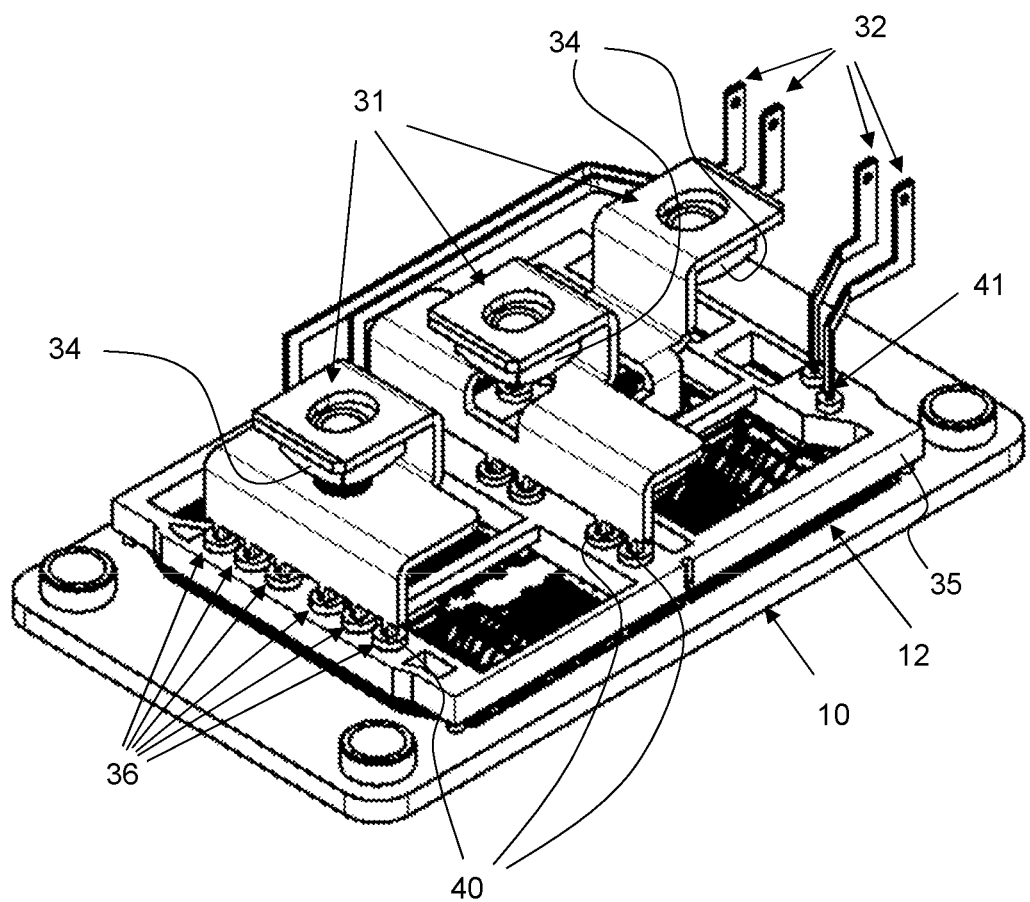

In FIG. 13 shows a power module according to the present invention with the plastic housing removed, in isometric view. The complexly shaped power terminals 31 and signal terminals 32 with their press-fit pins 41 are joined to the individual metal sleeve 36 or 40 molded in the alignment frame 35. The metal structures incorporated in the alignment frame 35 are soldered/sintered to the substrates 12 which are soldered/sintered at the same process step to the baseplate 10.

This power module can be adapted for many other technical fields. Simulations reveal a very low on-resistance which is up to a factor of two lower than competitor modules with identical outline. The internal stray inductance is also up to a factor of two lower compared to competitor modules. With the highly efficient utilization of the substrate area the world-wide highest current ratings can be achieved.

LIST OF NUMERALS

10 Baseplate
11 Solder/Sinter layer baseplate to substrate
12 Substrate
13 Solder/Sinter layer substrate to chip (either IGBT or diode or MOSFET)
14 Insulated-gate bipolar transistor (IGBT)
15 Diode
16 Wire bonds to chip
17 Power terminal
18 Signal terminal
19 Housing
20 Insulated wires for signal terminal connection
21 Copper-sheet
30 Housing with molded power and signal terminals
31 Power terminals with multiple press-fit connectors
32 Signal terminal with single press-fit connector
33 Plastic ridge
34 Nut
35 Alignment frame
36 Sleeve
37 Metal sheet
38 Pillar
39 Spacer 40 Small sleeve
41 Single press-fit pin
42 Solder/sinter preforms
43 Temporarily applied fixture for alignment frame positioning to baseplate

The invention claimed is:

1. A process for manufacturing a power module comprising:
placing a bottom part baseplate-alignment frame onto substrates, wherein the power module comprises a top-part housing assembly and the bottom part baseplate-alignment frame, wherein the top-part housing assembly includes integrated nuts and a molded power terminal and signal terminal in a plastic matrix, wherein the power terminal and the signal terminal result in one or more downward facing press-fit pins, wherein the bottom part baseplate-alignment frame includes a baseplate with soldered/sintered substrates and a soldered/sintered alignment frame of high-temperature plastic that comprises a space and pillars to position underlying substrates during a solder/sinter process to follow, wherein a distance of sleeves stick out of the alignment frame and is individually adjustable to compensate a bow of the baseplate, the process characterized in that, before pressing the top-part housing assembly of the power module with downwardly directed press-fit pins into corresponding sleeves, the alignment frame is placed by a robot precisely onto the substrates by:
a) the robot picking and placing a temporary fixture-set onto a baseplate,
b) the robot picking and placing solder/sinter onto the baseplate within the fixture set,
c) the robot picking and placing the substrates onto the solder/sinter within the fixture set,
d) the robot picking and placing the alignment frame onto the substrates within the fixture set,
e) heat-soldering/-sintering the alignment frame with the substrates, solder/sinter layer onto the baseplate by heat applied while the alignment frame aligns the substrates underneath during this high temperature processing, and
f) the robot removing the fixture set after cooling down of the soldered/sintered unit.

2. The process for manufacturing a power module according to claim 1, wherein after step f); applying high force in vertical direction exceeding 1 kN by the robot, in order to press the top-part housing assembly with the downwardly directed press-fit pins into corresponding sleeves which are held by the alignment frame to establish a permanent tight mechanical and electrical connection to the substrates below, and contemporarily welding and/or gluing together the housing and baseplate along their outer edges.

3. The process of claim 1, wherein the molded power- and signal terminals and associated ridges form a structure that is capable of supporting pressure forces beyond 1 kN.

4. A power module comprising:
a top-part housing assembly with integrated nuts and molded power- and signal terminals in a plastic matrix, wherein the power and signal terminals result in one or more downward facing press-fit pins; and
a bottom part baseplate-alignment frame assembly which includes a baseplate with soldered/sintered substrates and a soldered/sintered alignment frame of high-temperature plastic that comprises a space and pillars to position underlying substrates during a solder/sinter process to follow, wherein a distance of the sleeves stick out of the alignment frame and is individually adjustable to compensate a bow of the baseplate, wherein before pressing the top-part housing assembly with downwardly directed press-fit pins into corresponding sleeves, the alignment frame is placed by a robot onto the substrates by placing a temporary fixture set onto a baseplate, placing of solder/sinter onto the baseplate within the fixture set, placing the substrates onto the solder/sinter within the fixture set, placing the alignment frame onto the substrates within the fixture set, heat-soldering/-sintering the alignment frame with the substrates, solder/sinter layer onto the base plate by heat applied while the alignment frame aligns the substrates underneath during the high temperature processing, and removing the fixture set after cooling down of the soldered/sintered unit.

5. The power module of claim 4, further comprising copper sleeves of one or more dimensions positioned and oriented for an inter-substrate electrical connection.

6. The power module of claim 4, further comprising positioning and orienting copper sleeves of one or more dimensions and copper sheets for an inter-substrate electrical connection on substrates.

7. The power module of claim 4, wherein adjusted distances of the sleeves sticking out of the alignment frame compensate a bow of the baseplate.

8. The power module of claim 4, wherein the soldered/sintered alignment frame is connected mechanically and electrically to the top-part housing assembly by friction forces of press-fit pins which penetrate into corresponding sleeves.

9. The power module of claim 8, wherein the corresponding sleeves are held by an alignment frame and are connected to provide a mechanical and electrical connection to the substrates by the press-fit pins.

10. The power module of claim 8, wherein the molded power- and signal terminals and associated ridges form a structure that is capable of supporting pressure forces beyond 1 kN.

* * * * *